US009224099B2

(12) United States Patent
Koizumi

(10) Patent No.: US 9,224,099 B2
(45) Date of Patent: Dec. 29, 2015

(54) QUANTUM COMPUTER

(75) Inventor: Hiroyasu Koizumi, Tsukuba (JP)

(73) Assignee: UNIVERSITY OF TSUKUBA, Tsukuba-Shi, Ibaraki (JP)

( * ) Notice: Subject to any disclaimer, the term of this patent is extended or adjusted under 35 U.S.C. 154(b) by 628 days.

(21) Appl. No.: 13/805,181

(22) PCT Filed: Jun. 17, 2011

(86) PCT No.: PCT/JP2011/063881
§ 371 (c)(1),
(2), (4) Date: Dec. 18, 2012

(87) PCT Pub. No.: WO2011/162172
PCT Pub. Date: Dec. 29, 2011

(65) Prior Publication Data
US 2013/0088224 A1 Apr. 11, 2013

(30) Foreign Application Priority Data

Jun. 23, 2010 (JP) ................................ 2010-142978

(51) Int. Cl.
*B82Y 10/00* (2011.01)
*G01R 33/24* (2006.01)
*G06N 99/00* (2010.01)

(52) U.S. Cl.
CPC ............. *G06N 99/002* (2013.01); *B82Y 10/00* (2013.01); *G01R 33/24* (2013.01)

(58) Field of Classification Search
USPC .......................... 324/300–322; 600/407–435; 382/128–131
See application file for complete search history.

(56) References Cited

U.S. PATENT DOCUMENTS 6,486,756 B2 * 11/2002 Tarutani .................. H01L 27/18
257/E27.007
2001/0025012 A1 * 9/2001 Tarutani .................. H01L 27/18
505/100

(Continued)

FOREIGN PATENT DOCUMENTS

| JP | 2003-227805 A | 8/2003 |
| JP | 2003-260700 A | 9/2003 |
| JP | 2006-135054 A | 5/2006 |

(Continued)

OTHER PUBLICATIONS

PCT, "International Search Report for PCT/JP2011/063881," Sep. 20, 2011.

*Primary Examiner* — Melissa Koval
*Assistant Examiner* — Tiffany Fetzner
(74) *Attorney, Agent, or Firm* — Manabu Kanesaka

(57) ABSTRACT

Values of quantum bits used for a quantum computer is stabilized and the number of quantum bits per element is set to be 100 or more while ensuring quantum state stability during calculation of the quantum bits, quantum state controllability, and capability of achieving large-scale integration of quantum bits. Quantum calculation is performed as generating a spin vortex 6 centered on each hole 4 formed at a copper oxide superconductor thin film 3 by applying a magnetic field to a quantum bit substrate 1 having the copper oxide superconductor thin film 3 at which a plurality of the holes 4 are doped and irradiating an electromagnetic wave 19 containing quantum calculation data to the quantum bit substrate 1 in a state that a clockwise loop current 5 or a counterclockwise loop current 5 is generated in accordance with a position of each hole 4 and each spin vortex 6.

5 Claims, 6 Drawing Sheets

(56) References Cited

U.S. PATENT DOCUMENTS

2010/0258746 A1* 10/2010 Na ................. G06N 99/002 250/493.1
2013/0088224 A1* 4/2013 Koizumi ............ G06N 99/002 342/300

FOREIGN PATENT DOCUMENTS

| JP | 2007-516610 A | 6/2007 | | |
|---|---|---|---|---|
| JP | 2008-527684 A | 7/2008 | | |
| JP | 2008-539480 A | 11/2008 | | |
| WO | WO 2011162172 A1 * | 12/2011 | ............ | B82Y 10/00 |

* cited by examiner

QUANTUM COMPUTER

RELATED APPLICATIONS

The present application is National Phase of International Application No. PCT/JP2012/063881 filed Jun. 17, 2011, and claims priority from Japanese Application No. 2010-142978, filed Jun. 23, 2010.

TECHNICAL FIELD

The present invention relates to a quantum computer which performs quantum calculation as defining quantum bits using loop currents occurring around holes or electrons doped at a Mott insulator thin film when a magnetic field is applied to the Mott insulator thin film, for example.

BACKGROUND ART

A traditional type computer is capable of having only a value of "0" or "1" for one bit. In contrast, a quantum computer can hold values of combination of "0" and "1" in an arbitrary ratio for one bit. With "n" pieces of quantum bits, "$2^n$" pieces of states can be calculated in parallel. Such a quantum computer adopts quantum bits of nuclear spins, polarization of photons or the like, for example.

So far, quantum computers have been proposed using quantum bits described below (e.g., see Patent Literatures 1 to 3).
(1) Usage of nuclear magnetic resonance (usage of nuclear spin states)
(2) Usage of ion traps (usage of ionic electron states)
(3) Usage of quantum optics (usage of photon polarization)
(4) Usage of quantum dots (usage of states with different charge numbers)
(5) Usage of superconductor quantum bits (Usage of the number of magnetic fluxes or Cooper pairs)

Naturally, quantum bits used in quantum computers are required to have three properties described below.
(1) Quantum states being stable during calculation
(2) Variation of quantum states being controllable
(3) Large-scale integration being enabled

CITED LITERATURE

Patent Literature

Patent Literature 1: Japanese Patent Application Laid-Open No. 2006-135054
Patent Literature 2: Japanese Patent Application Laid-Open No. 2003-227805
Patent Literature 3: Japanese Patent Application Laid-Open No. 2003-260700

SUMMARY OF THE INVENTION

Problems to be Solved by the Invention

By the way, among traditional quantum computers, for example, a nuclear magnetic resonance type quantum computer performs definition and control of quantum bits based on Hamiltonian (motion equation) indicated by the following expression.

$$H = \sum_{i=1}^{N} \frac{\varepsilon_i}{2} I_i + \sum_{i>j} J_{ij} I_i I_j \quad \text{[Expression 1]}$$

Here, "H" denotes Hamiltonian, "N" denotes the total number of quantum bits, "$I_i$" denotes a quantum state of ith nuclear spin (being "1" for an upward spin and "−1" for a downward spin), "$\varepsilon_i$" denotes ith energy difference between quantum states, and "$J_{ij}$" denotes energy of interaction acting between ith and jth nuclear spins.

Further, the maximum value of controllable quantum bits capable of being used for a nuclear magnetic resonance type quantum computer with the abovementioned nuclear spin states being quantum bits is twelve quantum bits (achieved in 2006). This is the maximum record of all quantum computers. It has been considered that drastic increase of the number of quantum bits is difficult to be obtained with quantum bits proposed so far.

For putting quantum computers into practical use, quantum bits are required to be 100 or more. It has been strongly desired to develop quantum bits capable of being 100 or more. However, quantum bits used for traditional quantum computers have not necessarily satisfied the abovementioned three main properties and achievement thereof has been unpromising.

To address the above issues, an object of the present invention is to provide a quantum computer in which the number of quantum bits per element is 100 or more as generating stable quantum bits and which ensures properties required for quantum bits, that is, quantum state stability during calculation, quantum state controllability, and capability of achieving large-scale integration of quantum bits.

Further, an object of the present invention is to enable manufacturing of a Mott insulator thin film using a copper oxide superconductor which can be prepared relatively inexpensively with established crystal-growing method, thereby providing a quantum computer in which the number of quantum bits per element can be 100 or more and which ensures properties required for quantum bits, that is, capability of stably maintaining a quantum state during calculation, controlling variation of a quantum state, and achieving large-scale integration of quantum bits, while manufacturing cost of a quantum bit substrate is suppressed to be low.

Further, an object of the present invention is to provide a quantum computer in which relation between among quantum bits and positions of holes or electrons doped at a quantum bit substrate is optimized and the number of quantum bits per element can be 100 or more and which ensures properties required for quantum bits, that is, capability of stably maintaining a quantum state during calculation, controlling variation of a quantum state, and achieving large-scale integration of quantum bits.

Further, an object of the present invention is to provide a quantum computer in which the number of quantum bits per element is 100 or more by adjusting an energy difference between quantum states of the respective quantum bits as well as a position of each hole or each electron doped at a quantum bit substrate and which is capable of achieving large-scale integration of quantum bits.

To achieve the above object, the present invention provides a quantum computer for performing quantum calculation using quantum bits including a quantum bit substrate which includes a Mott insulator thin film at which one or more holes or one or more electrons are doped during manufacturing, a magnetic field generating unit which applies a magnetic field to the quantum bit substrate to generate a spin vortex centered on each hole or each electron formed at the Mott insulator thin film and to generate a clockwise loop current or a counterclockwise loop current corresponding to the spin vortex, a quantum calculation data supply unit which generates and irradiates a strong electromagnetic wave enabling to cause Rabi oscillation among the respective quantum bits to the quantum bit substrate, and a quantum calculation result readout unit which extracts a quantum calculation result of the quantum bit substrate by specifying a turning direction of the loop current due to polarization dependency of reflected light or transmitted light.

Further, in the present invention, a hole-doped type copper oxide superconductor thin film is used as the Mott insulator thin film in the quantum computer according to claim 1.

Further, in the present invention, a position of each hole or each electron doped at the Mott insulator thin film is adjusted by operating a probe of a scanning type probe microscope before performing quantum calculation at the quantum bit substrate.

Further, in the present invention, an energy difference between states of the respective quantum bits is adjusted before performing quantum calculation at the quantum bit substrate by applying an uneven magnetic field to the quantum bit substrate with the magnetic field generating unit.

Furthermore, in the quantum computer of the present invention, the quantum bit substrate is initialized as unifying all loop currents corresponding to the respective holes or the respective electrons formed at the Mott insulator thin film to be clockwise or to be counterclockwise by applying a strong magnetic field to the quantum bit substrate with the magnetic field generating unit when an initialization instruction is input.

According to a quantum computer described in claim 1 of the present invention, it is possible to set the number of quantum bits per element to be 100 or more as generating stable quantum bits and to ensure properties required for quantum bits, that is, quantum state stability during calculation, quantum state controllability, and capability of achieving large-scale integration of quantum bits.

Further, according to a quantum computer of claim 2, it is possible to manufacture a Mott insulator thin film using a hole-doped type copper oxide superconductor which can be prepared relatively inexpensively, and accordingly, it is possible to set the number of quantum bits per element to be 100 or more and to ensure properties required for quantum bits, that is, capability of stably maintaining a quantum state during calculation, controlling variation of a quantum state, and achieving large-scale integration of quantum bits, while manufacturing cost of a quantum bit substrate is suppressed to be low.

Further, according to a quantum computer of claim 3, it is possible to optimize relation among quantum bits with optimization of a position of each hole or each electron doped at a quantum bit substrate, to set the number of quantum bits per element to be 100 or more, and to ensure properties required for quantum bits, that is, capability of stably maintaining a quantum state during calculation, controlling variation of a quantum state, and achieving large-scale integration of quantum bits.

Further, according to a quantum computer of claim 4, it is possible to optimize relation among quantum bits by adjusting an energy difference between quantum states of the respective quantum bits formed at a quantum bit substrate as well as a position of each hole or each electron doped at the quantum bit substrate, to set the number of quantum bits per element to be 100 or more, and to ensure properties required for quantum bits, that is, capability of stably maintaining a quantum state during calculation, controlling variation of a quantum state, and achieving large-scale integration of quantum bits.

Furthermore, according to a quantum computer of claim 5, it is possible to initialize a quantum bit substrate with simple operation before performing quantum calculation at the quantum bit substrate, to set the number of quantum bits per element to be 100 or more, and to ensure properties required for quantum bits, that is, capability of stably maintaining a quantum state during calculation, controlling variation of a quantum state, and achieving large-scale integration of quantum bits.

EMBODIMENT OF THE INVENTION

First, a quantum bit used in the present invention will be described before detailed description of a quantum computer according to the present invention.

Figure 7:
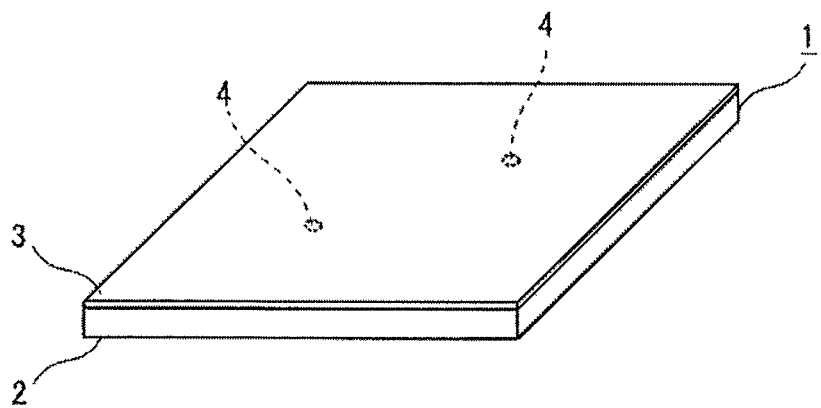
FIG. 7 is a perspective view illustrating an outline of a quantum bit substrate used in the quantum computer according to the present invention.

FIG. 7 is a perspective view illustrating an outline of a quantum bit substrate used in the quantum computer according to the present invention. The quantum bit substrate 1 illustrated in FIG. 7 is formed by growing a hole-doped type copper oxide superconductor thin film 3 being a lanthanum series, a bismuth series or an yttrium series on an $SrTiO_3$ base substrate 2. A $CuO_2$ plane in the thin film 3 is used as a two-dimensional Mott insulator thin film. A hole 4 doped due to strong electron-lattice interaction is localized at low temperature in the thin film. Owing to composition of the copper oxide superconductor, a two-dimensional Mott insulator thin film with a plurality of holes 4 doped is structured at the inside of the copper oxide superconductor thin film 3 in a thin film forming process.

Figure 8:
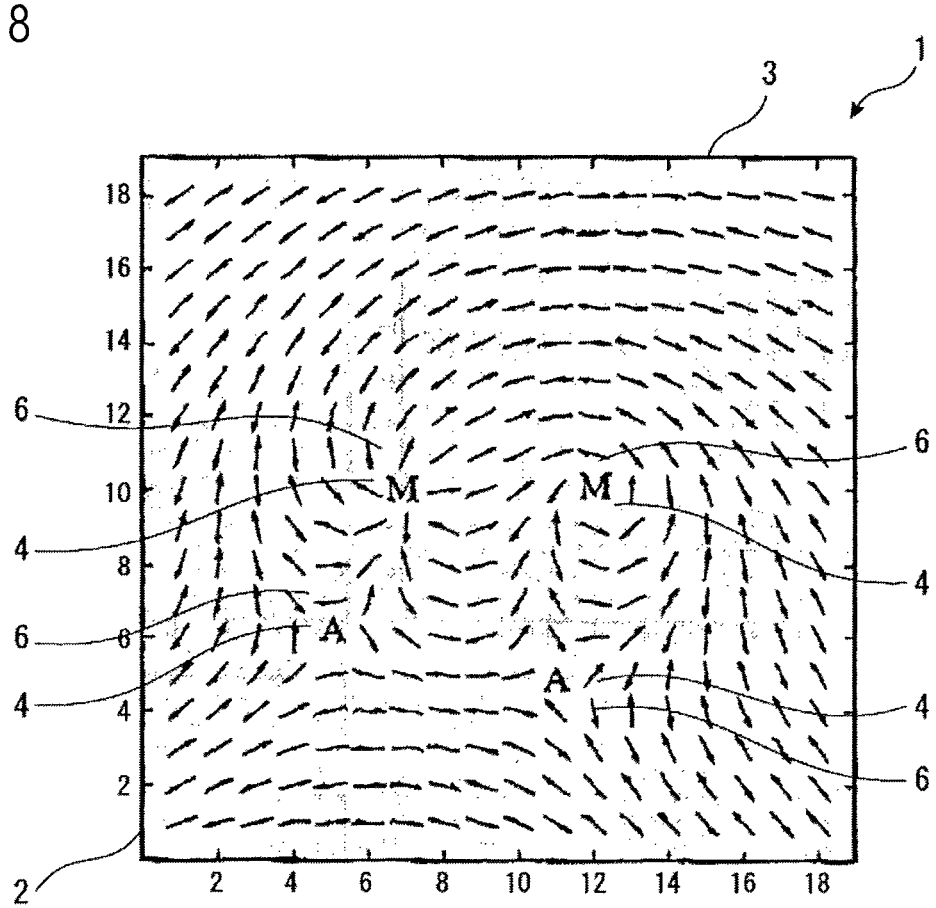
FIG. 8 is a schematic view illustrating relation between a hole doped in the quantum bit substrate illustrated in FIG. 7 and a spin vortex generated corresponding to the hole.
Figure 9:
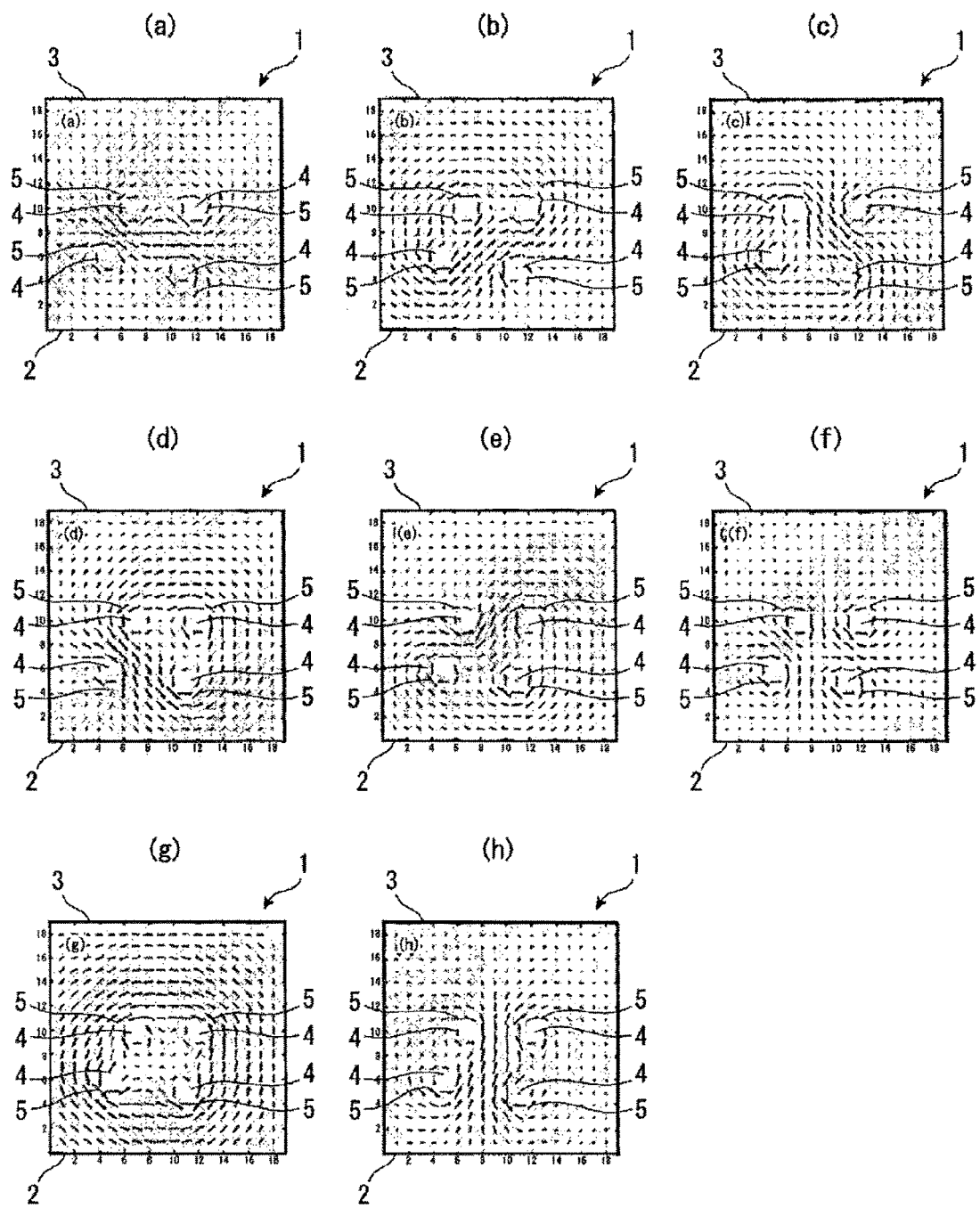
FIG. 9 is a schematic view illustrating examples of combination of clockwise loop currents and counterclockwise loop currents generated in the quantum bit substrate illustrated in FIG. 7.

Then, a strong uneven magnetic field is applied as illustrated in a schematic view of FIG. 8 in a state that the quantum bit substrate 1 is cooled with liquid helium or the like. Accordingly, a spin vortex 6 is generated with an axis being a center (point A, M) of each hole 4 doped in the CuO$_2$ plane of the copper oxide superconductor thin film 3. Then, a clockwise loop current 5 or a counterclockwise loop current 5 is generated by conjunction/separation of the respective spin vortexes 6. The inventor of the present application has theoretically proven that occurrence of the spin vortex 6 around the hole 4 causes a stable loop current 5 to be generated therearound, and then, has confirmed that a spin vortex and the loop current corresponding thereto are generated at copper oxide with theoretical simulation of test results.

In this state, one hole 4 is selected out of the holes 4 formed in the copper oxide superconductor thin film 3, and then, a probe of a scanning type probe microscope is closed to a section of the selected hole 4. Subsequently, a position of the selected hole 4 is adjusted by shifting a position of the probe. Thereafter, the other holes 4 are arranged to obtain appropriate magnitude of interaction among the respective quantum bits by performing the same process thereon. Further, utilization of the uneven magnetic field enables single bit operation of each quantum bit to be independently performed as each energy difference between quantum states of the respective quantum bits differs from one another.

According to the above, it is to be in one of "2$^n$" pieces of states when the number of the holes 4 is "n". For example, when the number of the holes 4 is "4", it is to be in one of eight states illustrated in FIGS. 9(a) to 9(h) and eight states obtained by inverting the above eight states (eight states as clockwise loop currents 5 being inverted to counterclockwise loop currents 5 and counterclockwise loop currents 5 being inverted to clockwise loop currents 5).

In the present invention, quantum bits are controlled based on Hamiltonian indicated by the following expression with the respective clockwise loop currents 5 and the respective counterclockwise loop currents 5 generated by conjunction/separation of the spin vortexes 6 of the respective holes 4 by using the quantum bit substrate 1.

$$H = \sum_{i=1}^{N} \frac{\varepsilon_i}{2} w_i + \sum_{i>j} J_{ij} w_i w_j \quad \text{[Expression 2]}$$

Here, "H" denotes Hamiltonian, "N" denotes the total number of quantum bits, "$W_i$" denotes a quantum state of ith loop current 5 (being "1" for a clockwise loop current 5 and "−1" for a counterclockwise loop current 5), "$\varepsilon_i$" denotes ith energy difference between quantum states, and "$J_{ij}$" denotes energy of interaction acting between ith and jth loop currents.

Here, since a position of each hole 4 and an energy difference between quantum states of the respective quantum bits are adjusted by utilizing an uneven magnetic field and a scanning type probe microscope, quantum bit control is easily performed.

For performing quantum calculation, quantum calculation data corresponding to calculation target data is generated and a strong electromagnetic wave having a wavelength corresponding to the quantum calculation data are irradiated to the quantum bit substrate 1 for a predetermined time in predetermined order. Accordingly, a renewed quantum state corresponding to the quantum calculation data can be generated.

Further, for extracting a calculation result of quantum calculation, strong coherent light with a narrowed beam diameter is generated and is irradiated to the respective quantum bits of the quantum bit substrate 1. Polarization dependency of reflected light or transmitted light thereof is measured to obtain states of the respective quantum bits after the quantum calculation, so that the calculation result can be obtained.

Figure 1:
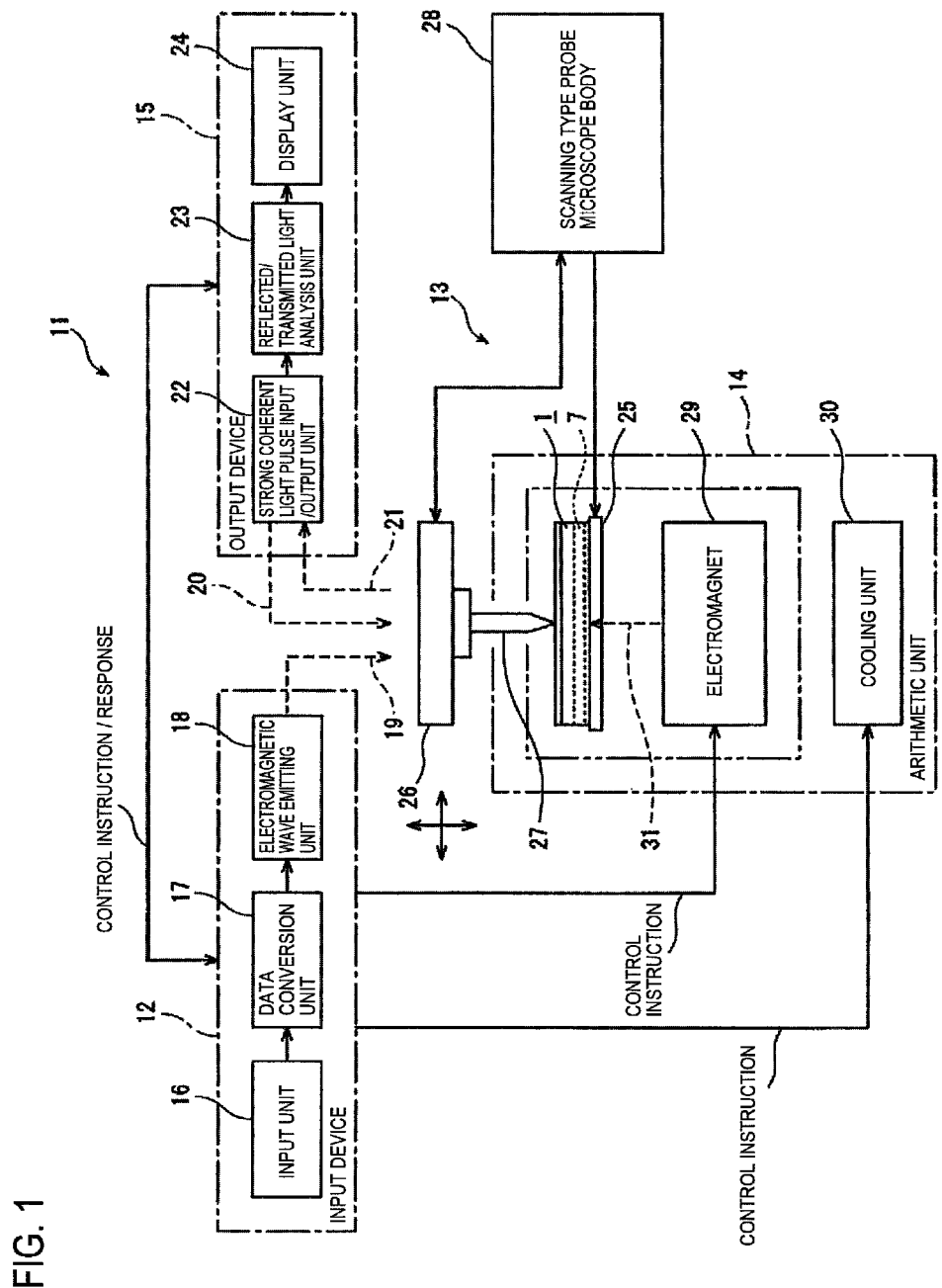
FIG. 1 is a block diagram illustrating an embodiment of a quantum computer according to the present invention.

FIG. 1 is a block diagram illustrating an embodiment of a quantum computer according to the present invention. A quantum computer 11 illustrated in FIG. 1 includes an input device 12 which is operated by an operator, a scanning type probe microscope 13 which is used for adjusting positions of holes at the quantum bit substrate 1, an arithmetic unit 14 which performs quantum calculation using the quantum bit substrate 1, and an output device 15 which reads out and displays a quantum calculation result of the quantum bit substrate 1. Here, quantum calculation is performed by the quantum bit substrate 1 while an electromagnetic wave 19 corresponding to quantum calculation data being a calculation target is emitted from the input device 12 in a state that positions of the respective holes 4 doped at the quantum bit substrate 1 in the arithmetic unit 14 are adjusted with operation of the scanning type probe microscope 13 and the arithmetic device 14. Subsequently, a strong coherent light pulse 20 with a narrowed beam diameter is emitted from the output device 15 and is irradiated to the quantum substrate 1. A quantum calculation result is measured and displayed on a screen owing to polarization dependency of reflected light or transmitted light.

The input device 12 includes an input unit 16 which is structured with an input component such as a keyboard and a mouse as being similar to a normal computer, a data conversion unit 17 which converts calculation target data output from the input unit 16 into quantum calculation data, and an electromagnetic wave emitting unit 18 which emits an electromagnetic wave 19 with a wavelength and light strength corresponding to the quantum calculation data output from the data conversion unit 17. Here, when an operational instruction such as a quantum calculation preparation instruction and a quantum calculation result read-out instruction is input with operation of the input unit 16, a control instruction corresponding to the operational instruction is generated and the arithmetic unit 14 and the output device 15 are controlled to perform quantum calculation preparation operation, quantum calculation result read-out operation, or the like. Further, when a quantum calculation instruction is input along with calculation target data with operation of the input unit 16, the input calculation target data is converted into quantum calculation data. Then, the electromagnetic wave 19 with a wavelength and light strength corresponding to the quantum calculation data is generated and is irradiated to the quantum bit substrate 1 of the arithmetic unit 14 for an irradiation time corresponding to the calculation data.

Further, since magnetism in nano-size and a loop current can be detected with a coherent X-ray beam with a narrowed beam diameter, the output device 15 of the quantum computer includes a strong coherent light pulse input/output unit 22 which generates and irradiates the strong coherent light pulse 20 with a narrowed beam diameter to the quantum bit substrate 1 of the arithmetic unit 14 in accordance with the control instruction from the input device 12 and which consequently generates a receiving signal as taking in reflected light or transmitted light from the quantum bit substrate 1, a reflected/transmitted light analysis unit 23 which analyzes variation of polarized light output from the strong coherent light pulse input/output unit 22 and which generates a quantum calculation result, and a display unit 24 which takes in and displays the quantum calculation result output from the reflected/transmitted light analysis unit 23 on a screen.

Here, when a read-out instruction signal (control signal) which instructs to start reading-out from the input device 12, the strong coherent light pulse 20 with a narrowed beam diameter is generated and is irradiated to each quantum bit of the quantum bit substrate 1 of the arithmetic unit 14. Then, reflected light 21 is taken in and a state of each quantum bit is specified with polarization analysis. The above is performed for every quantum bit to obtain a result of quantum calculation and the calculation result is displayed on a screen.

Further, the scanning type probe microscope 13 includes a fixing base 25 which fixes the quantum bit substrate 1 as being placed in the arithmetic unit 14, a triaxial stage 26 which moves a probe attaching portion at the lower side in directions of X, Y and Z based on input positional data as being moved in and out of the arithmetic device 14 with manual operation of the operator, a probe 27 which is attached to the probe attaching portion of the triaxial stage 26 which probes a surface state of the quantum bit substrate 1 in a state of being closed to the surface of the quantum bit substrate 1, and a scanning type probe microscope body 28 which is placed in the vicinity of the arithmetic unit 14.

Here, the scanning type probe microscope body 28 detects a surface state of the copper oxide superconductor thin film 3 of the quantum bit substrate 1 as moving the probe 27 with controlling of the triaxial stage 26 in accordance with operational details of the operator and adjusts a position of each hole 4 doped in the copper oxide superconductor thin film 3. Then, after the triaxial stage 26 is moved into the arithmetic unit 14 with manual operation of the operator, the scanning type probe microscope body 28 is operated by the operator.

Each time when positional data, a scanning instruction or the like is newly input, the position of each hole 4 doped in the copper oxide superconductor thin film 3 of the quantum bit substrate 1 is adjusted by shifting the position of the probe 27 as controlling the triaxial stage 26. After the positional adjustment of each hole 4 formed at the quantum bit substrate 1 is completed, the triaxial stage 26 is moved out of the arithmetic unit 14 with manual operation of the operator so that the triaxial stage 26 and the probe 27 do not block the strong coherent light 19 emitted from the input device 12, the strong coherent light pulse 20 with a narrowed beam diameter emitted from the output device 15, and the reflected light 21 from the quantum bit substrate 1.

Further, the quantum bit substrate 1 is formed by growing the hole-doped type copper oxide superconductor thin film 3 being a lanthanum series, a bismuth series or an yttrium series on the $SrTiO_3$ base substrate 2 (see FIG. 7). A $CuO_2$ plane in copper oxide is used as a two-dimensional Mott insulator thin film. Here, owing to composition in a forming process of copper oxide, a plurality of holes are in a state of being doped. As illustrated in FIG. 1, the arithmetic unit 14 includes an electromagnet 29 which provides an uneven magnetic field to the quantum bit substrate 1 by generating uneven magnetic force lines 31 as being arranged below the quantum bit substrate 1, and a cooling unit 30 (see FIG. 1) which cools the fixing base 25, the quantum bit substrate 1, the probe 27 of the scanning type probe microscope 13, the electromagnet 29 and the like by using liquid helium to stabilize positions of the respective holes 4 (see FIG. 3) doped at the quantum bit substrate 1, the loop currents 5 (see FIG. 3) and the like. Here, in a case that transmitted light of soft X-ray coherent light is used for reading-out, the quantum bit substrate 1 is set to be sufficiently thin and to be capable of being adjusted in position so that a beam hits to a position of the hole 4 (see FIG. 3) as being fixed to a sample stage 7 (see FIGS. 1 and 3).

Here, the clockwise loop current 5 and/or the counterclockwise loop current 5 are generated in the copper oxide superconductor thin film 3 of the quantum bit substrate 1 as providing a strong uneven magnetic field while cooling the quantum bit substrate 1. In this state, when the surface of the quantum bit substrate 1 is scanned by the probe 27 of the scanning type probe microscope 13, the position of each hole 4 formed in the copper oxide superconductor thin film 3 is adjusted in accordance with scanned details. Further, energy differences between quantum states of the respective quantum bits are differentiated with the uneven magnetic field. Initialization is performed as matching directions of loop currents by temporally strengthening the uneven magnetic field before starting calculation. The uneven magnetic field is returned into the previous state after the initialization. When the electromagnetic wave 19 containing the quantum calculation data is emitted from the input device 12 and is irradiated to the quantum bit substrate 1, quantum calculation corresponding to the quantum calculation data is performed as varying state of the respective holes 4, turning directions of the respective loop currents 5, and the like. After all calculation is completed, the strong coherent light pulse 20 with a narrowed beam diameter is emitted from the output device 15 to the quantum bit substrate 1. The quantum state of the quantum bit substrate 1 is specified by measuring polarization dependency of reflected light or transmitted light of the strong coherent light and is supplied to the output device 15.

Figure 2:
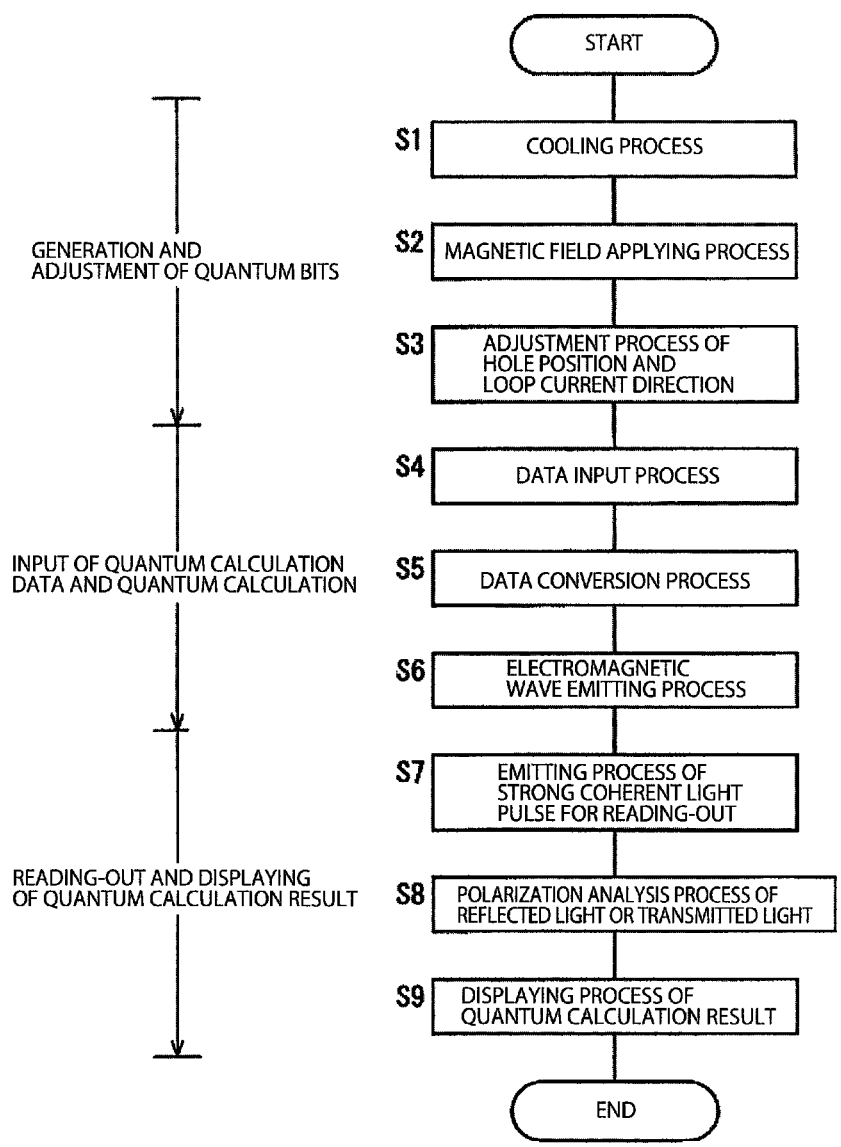
FIG. 2 is a flowchart illustrating an operational example of the quantum computer illustrated in FIG. 1.

Next, operation of the quantum computer 11 will be described with reference to a structural view illustrated in FIG. 1, a flowchart illustrated in FIG. 2, and schematic views illustrated respectively in FIGS. 3 to 6.

First, before starting quantum calculation, the triaxial stage 26 and the metal probe 27 are moved into the arithmetic unit 14 with manual operation of an operator.

Subsequently, when a cooling start instruction is input with operation of the input unit 16 of the input device 12, the cooling unit 30 is activated and the quantum bit substrate 1, the probe 27 of the scanning type probe microscope 13, and the like are cooled (step S1).

Subsequently, when a magnetic field generation instruction is input with operation of the input unit 16 of the input device 12 by the operator, the electromagnet 29 is activated and a magnetic field is applied to the quantum bit substrate 1, so that the spin vortex 6 is generated for each hole 4 doped in the copper oxide superconductor thin film 3 and the clockwise loop current 5 and the counterclockwise loop current 5 are generated in accordance with the spin vortexes (step S2).

Subsequently, the probe 27 of the scanning type probe microscope 13 is moved with operation of the scanning type probe microscope body 28 and positions of the holes 4 doped in the copper oxide superconductor thin film 3 of the quantum bit substrate 1 are adjusted (step S3).

Figure 3:
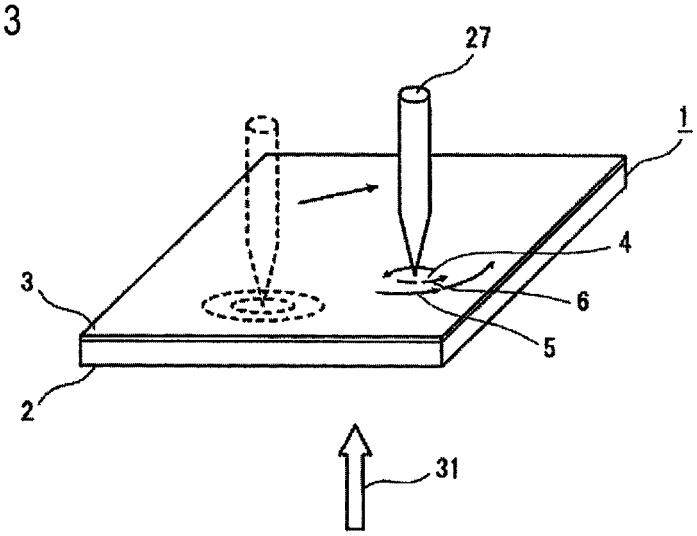
FIG. 3 is a schematic view illustrating an operational example when adjusting a position of a hole doped at a quantum bit substrate illustrated in FIG. 1 and a turning direction of a loop current.

At that time, since strength of the magnetic field applied to the quantum bit substrate 1 is to be uneven by the electromagnet 29 as illustrated in the schematic view of FIG. 3, energy differences between quantum states of the respective quantum bits are differentiated. Here, magnetic force lines generated by the electromagnet 29 are denoted by numeral 31.

Further, after positional adjustment of the respective holes 4 doped at the quantum bit substrate 1 is completed, the triaxial stage 26 is moved out of the arithmetic device 14 with manual operation of the operator to obtain a state without any blocking entity at the upper side of the quantum bit substrate 1. Then, after initialization is performed to set all loop currents clockwise or counterclockwise by temporally strengthening the uneven magnetic field, it is returned to the original uneven magnetic field.

Figure 4:
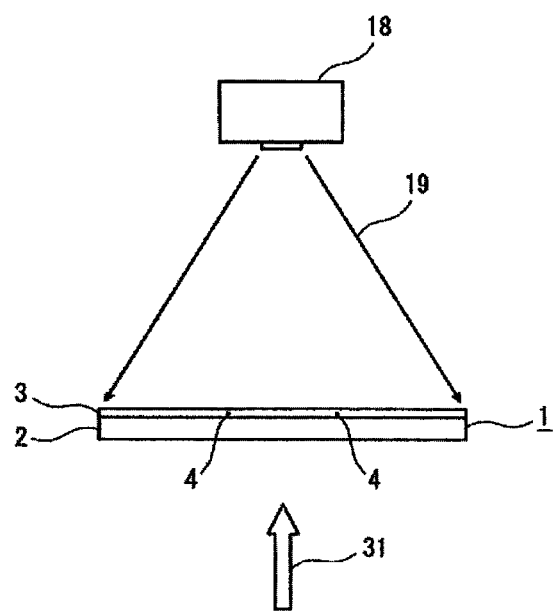
FIG. 4 is a schematic view illustrating an operational example when supplying quantum calculation data to the quantum bit substrate illustrated in FIG. 1.

In this state, when calculation target data is input with operation of the input unit 16 of the input device 12 or the like, the calculation target data is converted into quantum calculation data by the data conversion unit 17 of the input device 12 and the electromagnetic wave 19 containing light with a plurality wavelengths corresponding to the quantum calculation data is generated by the electromagnetic wave emitting unit 18 and is irradiated to the quantum bit substrate 1 of the arithmetic unit 14 as illustrated in a schematic view of FIG. 4.

With the above, the initial quantum state is varied into a state in which quantum states are overlapped in accordance with wavelengths contained in the electromagnetic wave 19 and irradiation time.

Thereafter, each time when the calculation target data is input with operation of the input unit 16 of the input device 12 or the like, the abovementioned quantum calculation operation is repeated to create a state in which quantum states are complexly entangled (steps S4 to S6).

Figure 5:
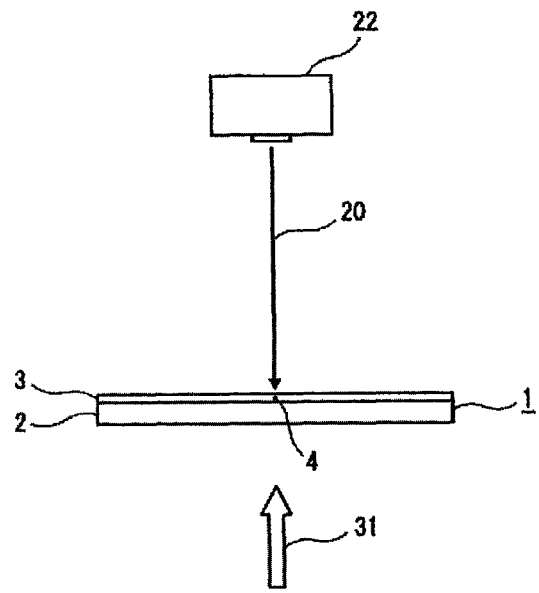
FIG. 5 is a schematic view illustrating an operational example when reading out a quantum calculation result from the quantum bit substrate illustrated in FIG. 1.
Figure 6:
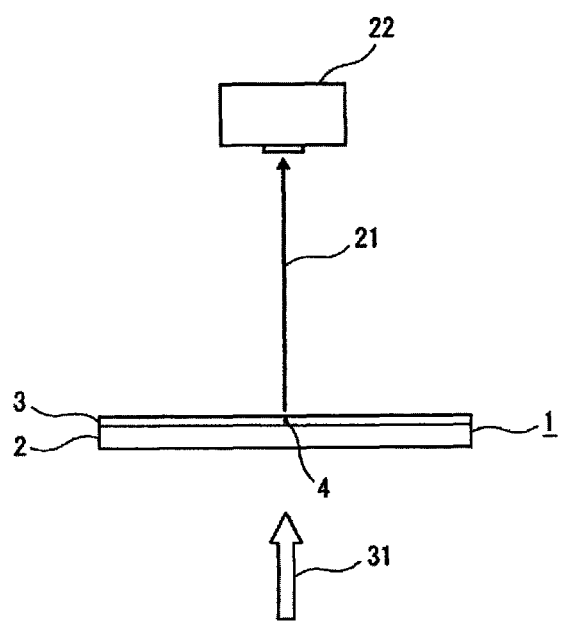
FIG. 6 is a schematic view illustrating an operational example when reading out a quantum calculation result from the quantum bit substrate illustrated in FIG. 1.

Subsequently, when a read-out instruction is input with operation of the input unit 16 of the input device 12 or the like, the strong coherent light pulse 20 with a narrowed beam diameter is generated by the strong coherent light pulse input/output unit 22 of the output device 15 and is irradiated to the respective quantum bits of the quantum bit substrate 1 as illustrated in a schematic view of FIG. 5 (step S7). Quantum bit states are acknowledged by receiving reflected light from the quantum bit substrate 1 at the strong coherent light pulse input/output unit 22 and analyzing polarization at the reflected light analysis unit 23 (see FIG. 6). The states of all quantum bits are measured and a quantum calculation result is obtained (step S8). The quantum calculation result is displayed on a screen at the display unit 24.

As described above, in the present embodiment, a magnetic field is applied to the quantum bit substrate 1 having the copper oxide superconductor thin film 3 in which the plurality of holes 4 are doped to generate the spin vortex 6 centered on each hole 4 formed at the copper oxide superconductor thin film 3 and the electromagnetic wave 19 containing the quantum calculation data is irradiated to the quantum bit substrate 1 in a state that the clockwise loop current 5 or the counterclockwise loop current 5 is generated in accordance with each spin vortex 6 at the position of each hole 4, so that the quantum calculation is performed. Accordingly, values of the quantum bits can be stabilized by utilizing stability of the respective loop current 5 and the number of quantum bits per element can be set to be 100 or more.

Further, it is possible to ensure properties required for quantum bits, that is, stability of a quantum state, controllability of a quantum state during calculation, and large-scale integration of quantum bits.

Further, in the present embodiment, since a hole-doped type copper oxide superconductor thin film which can be manufactured inexpensively is used as a Mott insulator thin film structuring the quantum bit substrate 1, manufacturing cost of the quantum bit substrate 1 can be suppressed to be low.

Further, in the present embodiment, since the positions of the respective holes 4 doped in the copper oxide superconductor thin film 3 are adjusted by operating the probe 27 of the scanning type probe microscope 13 before performing quantum calculation at the quantum bit substrate, relation among the respective quantum bits indicated by the abovementioned expression 2 can be optimized.

Further, in the present embodiment, an uneven magnetic field is applied to the quantum bit substrate 1 by the electromagnet 29. Then, for adjusting the positions of the respective holes 4 doped in the copper oxide superconductor thin film 3 with operation of the probe 27 of the scanning type probe microscope 13 on the quantum bit substrate 1 before performing quantum calculation, energy differences between quantum states of the respective quantum bits are adjusted to be differentiated by utilizing the uneven magnetic field. Accordingly, it can be easily performed to adjust relation among the respective quantum bits.

Further, when an initialization instruction is input with operation of the input unit 16 of the input device 12, the strong magnetic force lines 31 is generated by the electromagnet 29 and the strong magnetic field is applied to the quantum bit substrate 1 to unify all of the loop currents 5 corresponding the respective holes 4 doped in the copper oxide superconductor thin film 3 to be clockwise or counterclockwise. Thus, the quantum bit substrate 1 is initialized. According to the above, it is possible to provide specific values to the quantum bits at the quantum bit substrate 1 by initializing the quantum bit substrate 1 before performing quantum calculation (being an effect of claim 5).

Further, in the abovementioned embodiment, the copper oxide superconductor thin film in which the plurality of holes 4 are doped is adopted. However, it is also possible to use a copper oxide superconductor thin film in which a plurality of electrons are doped. Further, it is also possible to use a thin film made of other material belonging to a two-dimensional Mott insulator thin film in which a plurality of holes 4 or a plurality of electrons are doped. According to the above, the spin vortex 6 is generated about each hole 4 or each electron and the clockwise loop current 5 or the counterclockwise loop current 5 is generated. Thus, the quantum bits defined in the abovementioned expression 2 can be generated.

Further, in the abovementioned embodiment, since atomic arrangement is likely to be disarranged at a surface of the copper oxide superconductor thin film 3, the states of the respective holes 4 are to be stabilized as doping the plurality of holes 4 at a layer being at a slightly inner side from the surface of the copper oxide superconductor thin film 3. However, in a case that atomic arrangement is less likely to be disarranged at a surface of the copper oxide superconductor thin film 3 by performing coating on the surface of the copper oxide superconductor thin film 3, it is also possible to dope a plurality of holes 4 at a surface layer of the copper oxide superconductor thin film 3.

INDUSTRIAL APPLICABILITY

The present invention has industrial applicability as being related to a quantum computer which performs quantum calculation to define quantum bits by using loop currents occurring around holes or electrons doped at a Mott insulator thin film during applying a magnetic field to the Mott insulator thin film, for example.

DRAWING REFERENCE NUMERAL EXPLANATIONS

1: Quantum bit substrate
2: Base substrate
3: Copper oxide superconductor thin film (Mott insulator thin film)
4: Hole
5: Loop current
6: Spin vortex
7: Sample stage
11: Quantum computer
12: Input device
13: Scanning type probe microscope
14: Arithmetic unit
15: Output device
16: Input unit
17: Data conversion unit 18: Electromagnetic wave emitting unit (Quantum calculation data supply unit)
19: Electromagnetic wave
20: Strong coherent light pulse with narrowed beam diameter
21: Reflected light or transmitted light
22: Strong coherent light pulse input/output unit (Quantum calculation result read-out unit)
23: Reflected light analysis unit (Quantum calculation result read-out unit)
24: Display unit
25: Fixing base
26: Triaxial stage
27: Probe
28: Scanning type probe microscope body
29: Electromagnet (Magnetic field generating unit)
30: Cooling unit
31: Magnetic force line

The invention claimed is:

1. A quantum computer that performs quantum calculation using quantum bits, comprising:
    a quantum bit substrate which includes a Mott insulator thin film at which one or more holes or one or more electrons are doped during manufacturing;
    a magnetic field generating unit which applies a magnetic field onto the quantum bit substrate in order to generate a spin vortex centered on each hole, or each electron, that is formed at the Mott insulator thin film and thereby create a quantum bit, by generating a clockwise or counterclockwise loop current corresponding to the generated spin vortex state, while also providing an energy difference to two generated spin vortex states thereof;
    a quantum calculation data supply unit which generates and irradiates an electromagnetic wave including quantum calculation data with a strength required for causing each hole, or each electron, to be able to perform a Rabi oscillation at the quantum bit substrate; and
    a quantum calculation result read-out unit, which extracts a quantum calculation result of the quantum bit substrate, by irradiating a strong coherent light pulse with a narrowed beam diameter onto the quantum bit substrate, in order to analyze a polarization of the resulting reflected light or transmitted light at the quantum bit substrate.

2. The quantum computer according to claim 1, wherein a hole-doped type copper oxide superconductor thin film is used as the Mott insulator thin film.

3. The quantum computer according to claim 1, wherein a position of each hole, or each electron, doped at the Mott insulator thin film, is adjusted by operating a probe of a scanning type probe microscope, before performing quantum calculation(s), at the quantum bit substrate.

4. The quantum computer according to claim 1, wherein difference between energy states, of the respective quantum bits, is adjusted before performing a quantum calculation, at the quantum bit substrate, by applying an uneven magnetic field onto the quantum bit substrate with the magnetic field generating unit.

5. The quantum computer according to claim 1, wherein the quantum bit substrate is initialized as unifying all loop currents corresponding to the respective holes, or the respective electrons, that are formed at the Mott insulator thin film, to be either clockwise or counterclockwise, by applying a strong magnetic field onto the quantum bit substrate with the magnetic field generating unit, when an initialization instruction is input into the quantum computer.

* * * * *